(12) United States Patent
Choi et al.

(10) Patent No.: US 7,573,766 B2
(45) Date of Patent: Aug. 11, 2009

(54) PHASE CHANGE RANDOM ACCESS MEMORY AND METHOD OF TESTING THE SAME

(75) Inventors: Byung-gil Choi, Yongin-si (KR);
Beak-hyung Cho, Hwaseong-si (KR);
Du-eung Kim, Yongin-si (KR);
Chang-han Choi, Yongin-si (KR);
Yu-hwan Ro, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 144 days.

(21) Appl. No.: 11/898,125

(22) Filed: Sep. 10, 2007

(65) Prior Publication Data

US 2008/0062741 A1    Mar. 13, 2008

(30) Foreign Application Priority Data

Sep. 11, 2006    (KR) ................. 10-2006-0087632

(51) Int. Cl.
*G11C 29/00* (2006.01)
(52) U.S. Cl. ..................... 365/201; 365/148
(58) Field of Classification Search .............. 365/201, 365/148, 105, 163
See application file for complete search history.

(56) References Cited

U.S. PATENT DOCUMENTS 6,052,321 A * 4/2000 Roohparvar ............. 365/201
7,365,355 B2 * 4/2008 Parkinson ................ 257/3
2005/0047193 A1   3/2005 Bedeschi et al.

FOREIGN PATENT DOCUMENTS

| JP | 2004-047050 | 2/2004 |
|----|-------------|--------|
| KR | 10-0157292 | 7/1998 |
| KR | 10-0172439 | 10/1998 |
| KR | 1020050102952 A | 10/2005 |
| KR | 10-2005-0110680 | 11/2005 |

OTHER PUBLICATIONS

Notice of Allowance dated Sep. 9, 2008 in corresponding Korean Application No. 10-2006-0087632.
Office Action dated Mar. 10, 2008, in corresponding Korean Patent Application No. 10-2006-0087632.

* cited by examiner

*Primary Examiner*—Vu A Le
(74) *Attorney, Agent, or Firm*—Harness, Dickey & Pierce, P.L.C.

(57) ABSTRACT

Provided is a method of testing a phase change random access memory (PRAM). The method may include providing a plurality of PRAM cells each coupled between each of a plurality of first lines and each of a plurality of second lines intersecting the first lines, selecting at least one of the plurality of first lines while deselecting the remaining first lines and the plurality of second lines, pre-charging the selected at least one of the plurality of first lines to a predetermined or given voltage level, and sensing a change in the voltage level of the selected first line while supplying a monitoring voltage to the selected first line.

22 Claims, 12 Drawing Sheets

PHASE CHANGE RANDOM ACCESS MEMORY AND METHOD OF TESTING THE SAME

PRIORITY STATEMENT

This application claims priority under 35 U.S.C. § 119 to Korean Patent Application No. 10-2006-0087632, filed on Sep. 11, 2006, in the Korean Intellectual Property Office (KIPO), the entire contents of which are incorporated herein by reference.

BACKGROUND

1. Field

Example embodiments relate to a phase change random access memory and a method of testing the same.

2. Description of the Related Art

Phase change random access memories (PRAMs) store data using a phase change material, e.g., a chalcogenide alloy, which goes into a crystalline state or an amorphous state due to a change in temperature by cooling followed by heating. In other words, because resistance of a crystalline phase change material is lower whereas resistance of an amorphous phase change material is higher, the crystalline state may be referred to as a set or "0" data and the amorphous state may be referred to as a reset or "1" data.

As the integration density of PRAMs has recently increased, testing methods of PRAMs having improved reliability is highly desirable.

SUMMARY

Example embodiments provide a method of testing a phase change random access memory (PRAM) having improved reliability. Example embodiments also provide a phase change random access memory (PRAM) having improved reliability. Example embodiments will be described in or be apparent from the following description of example embodiments.

According to example embodiments, there is provided a method of testing a phase change random access memory (PRAM). The method may include providing a plurality of PRAM cells each coupled between each of a plurality of first lines and each of a plurality of second lines intersecting the first lines, selecting at least one of the plurality of first lines while deselecting the remaining first lines and the plurality of second lines, pre-charging the selected at least one of the plurality of first lines to a predetermined or given voltage level, and sensing a change in the voltage level of the selected first line while supplying a monitoring voltage to the selected first line.

According to example embodiments, there is provided a phase change random access memory (PRAM) including a plurality of PRAM cells coupled between each of a plurality of first lines and each of a plurality of second lines intersecting the plurality of first lines, a selection circuit selecting at least one first line among the plurality of first lines and deselecting remaining first lines an the plurality of second lines, a monitoring node coupled to the selected first line, a voltage applying pad coupled to the monitoring node and applying a monitoring voltage to the selected first line, and a monitoring pad coupled to the monitoring node and sensing a change in the voltage level of the monitoring node occurring due to a leakage current flowing from the selected first line to the unselected first line.

According to example embodiments, there is provided a phase change random access memory (PRAM) including a plurality of PRAM cells coupled between each of a plurality of bit lines and each of a plurality of word lines intersecting the plurality of bit lines, a selection circuit selecting at least one bit line among the plurality of bit lines and deselecting remaining bit lines and the plurality of word lines, a sensing node coupled to the selected bit line, a precharging unit coupled to the sensing node and precharging the selected bit line to a predetermined or given voltage level through the sensing node, a monitoring voltage supply unit coupled to the sensing node and applying a monitoring voltage to the selected bit line through the sensing node, and a sense amplifier coupled to the sensing node and sensing a change in the voltage level of the sensing node occurring due to a leakage current flowing from the selected bit line to the unselected bit line.

BRIEF DESCRIPTION OF THE DRAWINGS

Example embodiments will be more clearly understood from the following detailed description taken in conjunction with the accompanying drawings.

FIG. 1 is a diagram illustrating a method for testing PRAMs according to example embodiments;

FIGS. 2 and 3 are a circuit diagram of a PRAM according to example embodiments and a timing diagram illustrating a method for testing the PRAM shown in FIG. 2, respectively;

FIGS. 4 and 5 are a circuit diagram of a PRAM according to example embodiments and a timing diagram illustrating a method for testing the PRAM shown in FIG. 4, respectively;

FIG. 6 is a diagram illustrating a method for testing PRAMs according to example embodiments;

FIG. 7 is a diagram for illustrating an operation of an NPN parasitic bipolar transistor performed between a selected word line and its adjacent word line according to example embodiments;

FIG. 8 is a circuit diagram illustrating a method for testing a PRAM according to example embodiments; and FIG. 9 illustrates a circuit diagram and a timing diagram of a sub word line driver shown in FIG. 8 for illustrating an operation of the sub word line driver thereof;

FIG. 10 is a circuit diagram illustrating a method for testing a PRAM according to example embodiments; and FIG. 11 illustrates a circuit diagram of a sub word line driver shown in FIG. 10 and a timing diagram for illustrating an operation thereof; and FIG. 12 is a detailed circuit diagram of an inverter shown in FIG. 11.

Figure 1:
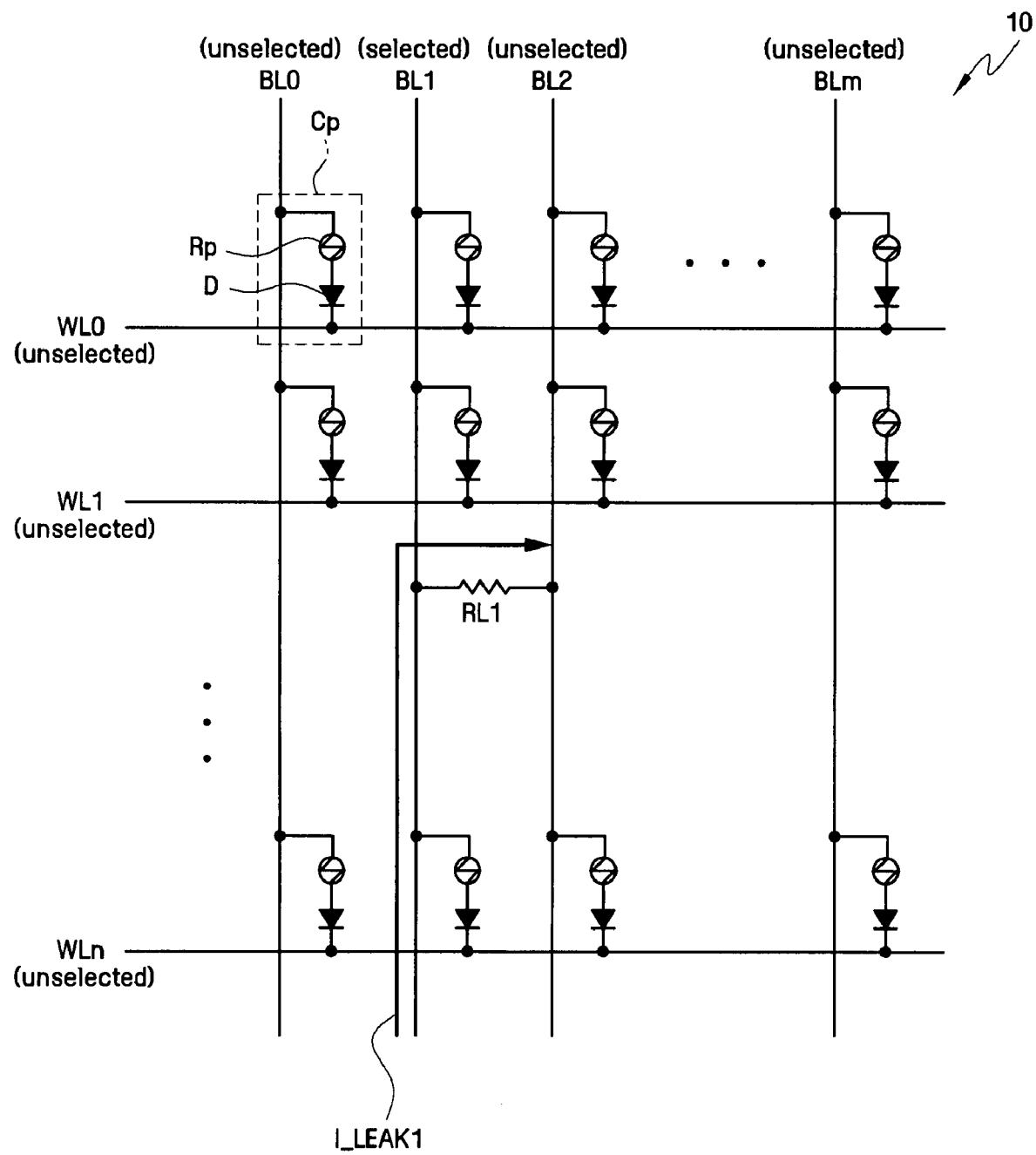
FIGS. 1-12 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Advantages and features of example embodiments and methods of accomplishing the same may be understood more readily by reference to the following detailed description of example embodiments and the accompanying drawings. Example embodiments may, however, be embodied in many different forms and should not be construed as being limited to the embodiments set forth herein. Rather, these embodiments are provided so that this disclosure will be thorough and complete and will fully convey the concept of example embodiments to those skilled in the art, and example embodiments will only be defined by the appended claims. Like reference numerals refer to like elements throughout the specification. Example embodiments will now be described more fully with reference to the accompanying drawings, in which example embodiments are shown.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, for brevity, some example embodiments will be described with regard to a phase change RAM (PRAM) but it will be understood by those of ordinary skill in the art that that example embodiments may also be applied to any types of nonvolatile memories using a resistor, e.g., a resistive RAM (RRAM), a ferroelectric RAM (FRAM), a magnetic RAM (MRAM) and/or a phase change RAM (PRAM).

FIG. 1 is a diagram illustrating a method for testing a PRAM according to example embodiments. Referring to FIG. 1, according to example embodiments, a memory cell array 10 of the PRAM may include a plurality of bit lines BL0~BLm extending in one direction, a plurality of word lines WL0~WLn extending so as to intersect the plurality of bit lines BL0~BLm, and a plurality of phase change memory cells (Cp's) each coupled between each of the plurality of word lines WL0~WLn and each of the plurality of bit lines BL0~BLm.

Each phase change memory cell Cp may include a variable resistor Rp having a phase change material that has two different resistance values depending on whether it changes into a crystalline phase or an amorphous phase, and an access element D controlling current passing through the variable resistor Rp. The access element D may be a diode or transistor in series connected to the variable resistor Rp. Unlike in FIG. 1, positions of the variable resistor Rp and the access element D may be reversed. The phase change material may be a binary (two-element) compound, e.g., GaSb, InSb, InSe, $Sb_2Te_3$ and/or GeTe, a ternary (three-element) compound, e.g., GeSbTe, GaSeTe, InSbTe, $SnSb_2Te_4$ and/or InSbGe and/or a quaternary (four-element) compound, e.g., AgInSbTe, (GeSn)SbTe, GeSb(SeTe) and/or $Te_{81}Ge_{15}Sb_2S_2$. The most commonly used phase change material may be GeSbTe.

The method for testing a PRAM according to example embodiments will now be described. In the discussion that follows, example embodiments may be illustrated by reference to a method of effectively monitoring a bit line bridge RL1 created between adjacent bit lines, e.g., between the bit lines BL1 and BL2.

A memory cell array 10 of the PRAM may be provided. Among the plurality of bit lines BL0~BLm, at least one bit line, e.g., BL1, may be selected, while the other bit lines BL0 and BL2~BLm and the plurality of word lines WL0~WLn may all be deselected. The selected bit line BL1 may be precharged to a voltage of a constant level, e.g., a power supply voltage VDD.

While supplying the selected bit line BL1 with a monitoring voltage, a change in the voltage level of the selected bit line BL1 may be sensed. When no leakage current path is provided, the change in the voltage level of the selected bit line BL1 may be sensed. On the contrary, when a leakage current path is provided, the voltage level of the selected bit line BL1 may be reduced. Referring to FIG. 1, the bit line bridge RL1 may be created between the selected bit line BL1 and its adjacent bit line BL2, so that the leakage current I_LEAK1 from the selected bit line BL1 toward the adjacent bit line BL2 may be generated. The method for testing the PRAM according to example embodiments will be described in detail with reference to FIGS. 2-4.

Figure 2:
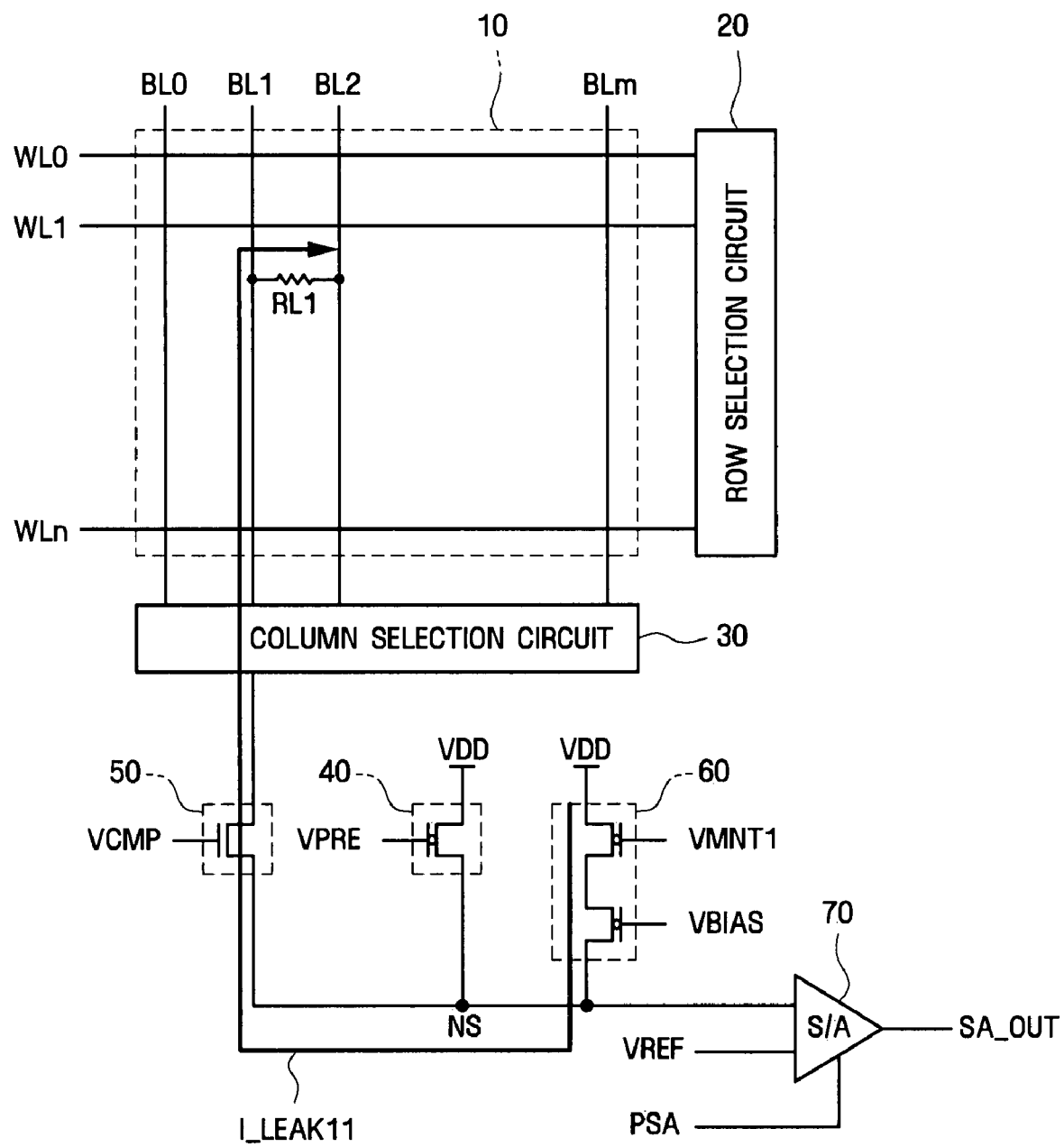
Figure 3:
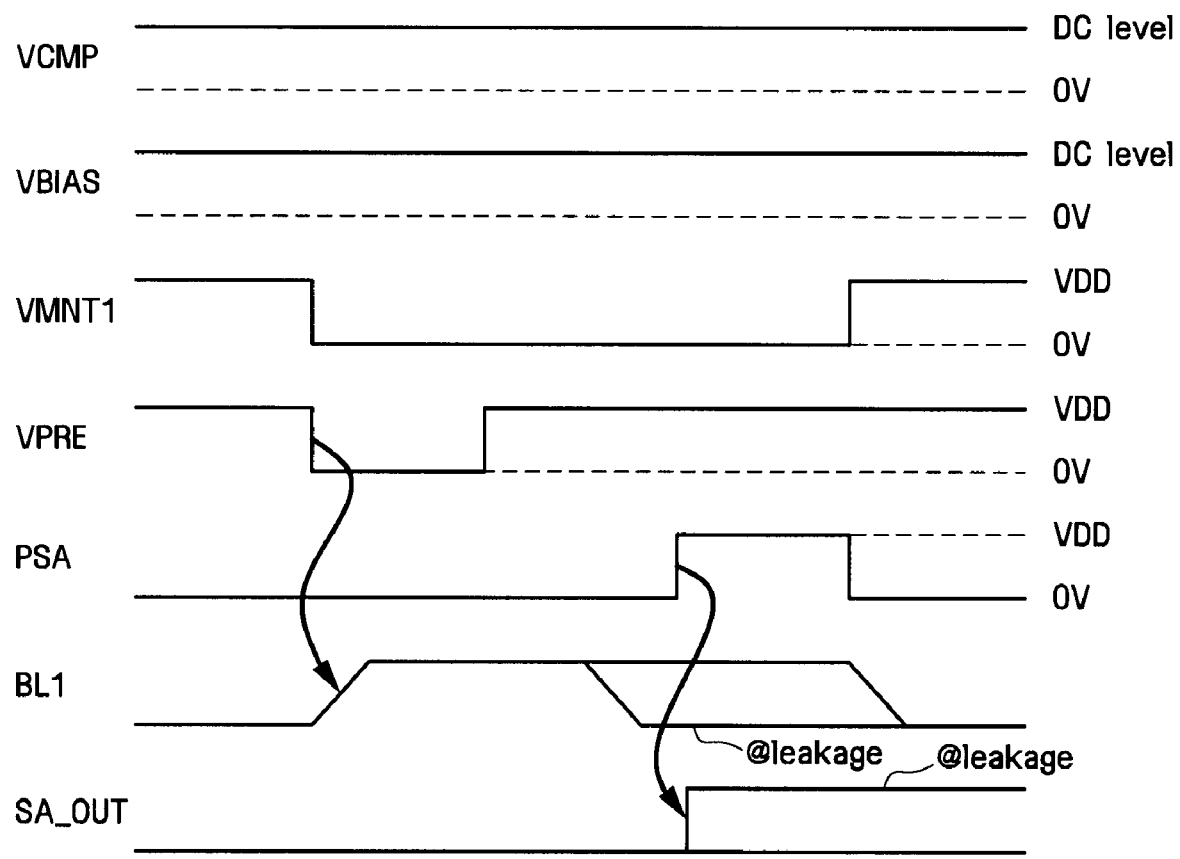

FIGS. 2 and 3 are a circuit diagram and a timing diagram illustrating a method for testing the PRAM according to example embodiments. Referring to FIGS. 2 and 3, the PRAM test method may be implemented using a sense amplifier (S/A) 70 installed in the PRAM, which senses whether or not the leakage current I_LEAK1 has occurred between the selected bit line BL1 and its adjacent bit line BL2.

Referring to FIG. 2, the PRAM may include a memory cell array 10, selection circuits 20 and 30, and monitoring circuits 40, 50, 60 and 70. The memory cell array 10 may include a plurality of bit lines BL0~BLm, a plurality of word lines WL0~WLn, and a plurality of phase change memory cells each coupled between each of the plurality of word lines WL0~WLn and each of the plurality of bit lines BL0~BLm. Referring to FIG. 2, a bridge RL1 may be formed between two adjacent bit lines BL1 and BL2.

The selection circuits 20 and 30 may include a row selector 20 and a column selector 30, respectively. The row selection circuit 20 may select at least one of the plurality of word lines WL0~WLn and the column selection circuit 30 may select at least one of the plurality of bit lines BL0~BLm. In example embodiments, the row selection circuit 20 may deselect the plurality of word lines WL0~WLn and the column selection circuit 30 may select at least one bit line, e.g., BL1, of the plurality of bit lines BL0~BLm, while bit lines BL0 and BL2 adjacent to the selected bit line BL1 may not be selected. The selection of both of the two bit lines BL0 and BL2 may prevent or reduce leakage current from being generated even when the bridge RL1 is formed between the two adjacent bit lines BL1 and BL2.

The monitoring circuits 40, 50, 60 and 70 may include a precharging unit 40, a clamping unit 50, a first monitoring voltage supply unit 60, and a sense amplifier (S/A) 70. The precharging unit 40 may precharge the selected bit line BL1 to a predetermined or given level through a sensing node NS coupled to the selected bit line BL1. The precharging unit 40 may be a PMOS transistor coupled between the power supply voltage VDD and the sensing node NS and applying a precharge control signal VPRE through its gate.

The clamping unit 50 may be coupled to the sensing node NS and clamps a voltage level of the selected bit line BL1 to a predetermined or given level, e.g., to a level of not greater than a threshold voltage level Vth of a phase change material. For example, if the threshold voltage level Vth of a phase change material is about 1.2 V, the clamping unit 50 may clamp the selected bit line BL1 to about 0.5 to about 1.0V. The clamping unit 50 may be an NMOS transistor coupled between the selected bit line BL1 and the sensing node NS and applying a clamping control signal VCMP through its gate.

The first monitoring voltage supply unit 60 may supply a monitoring voltage to the selected bit line BL1. The first monitoring voltage supply unit 60 may include two PMOS transistors serially coupled between power supply voltage VDD and the sensing node NS. Of the two PMOS transistors, one may be turned on in response to a first monitoring control signal VMNT1 and the other may be turned on in response to a second monitoring control signal VMNT2. The level of the monitoring voltage supplied to the selected bit line BL1 may be adjusted by adjusting the level of a bias signal VBIAS. The sense amplifier 70 may compare the level of the sensing node NS coupled to the selected bit line BL1 with a reference level VREF in response to a sense amplifier enable signal PSA, and may output a sense amplifier output signal SA_OUT as a comparison result. In example embodiments, the sense amplifier 70 may be implemented as a current sense amplifier or a voltage sense amplifier.

Referring to FIGS. 2 and 3, when a test operation starts, the first monitoring control signal VMNT1 may go low. The bias signal VBIAS may be supplied in the form of a constant voltage. Thus, the first monitoring voltage supply unit 60 may supply the monitoring voltage to the selected bit line BL1 through the sensing node NS. Concurrently, the precharge control signal VPRE may go low and the precharging unit 40 may supply a precharge voltage to the selected bit line BL1 through the sensing node NS. The clamping unit 50 may clamp the voltage level of the selected bit line BL1 to a level of not greater than a threshold voltage level Vth of a phase change material in response to the clamping control signal VCMP in the form of a constant voltage.

The precharge control signal VPRE may be activated back to a relatively high level, so that the precharging unit 40 may stop precharging the selected bit line BL1. If a bridge RL1 exists between the selected bit line BL1 and its adjacent bit line BL2, the leakage current I_LEAK1 from the selected bit line BL1 toward the adjacent bit line BL2 may be generated, a voltage level of the selected bit line BL1 may be reduced. Conversely, if there is no bridge RL1 between the selected bit line BL1 and its adjacent bit line BL2, suggesting that no leakage current path exists, the voltage level of the selected bit line BL1 may be maintained.

When the sense amplifier enable signal PSA transits to a relatively high level, the sense amplifier 70 may compare the level of the selected bit line BL1 with the reference level VREF. When the level of the bit line BL1 is lower than the reference level VREF due to the leakage current I_LEAK1, the sense amplifier 70 may output a sense amplifier output signal SA_OUT of a relatively high level.

Figure 4:
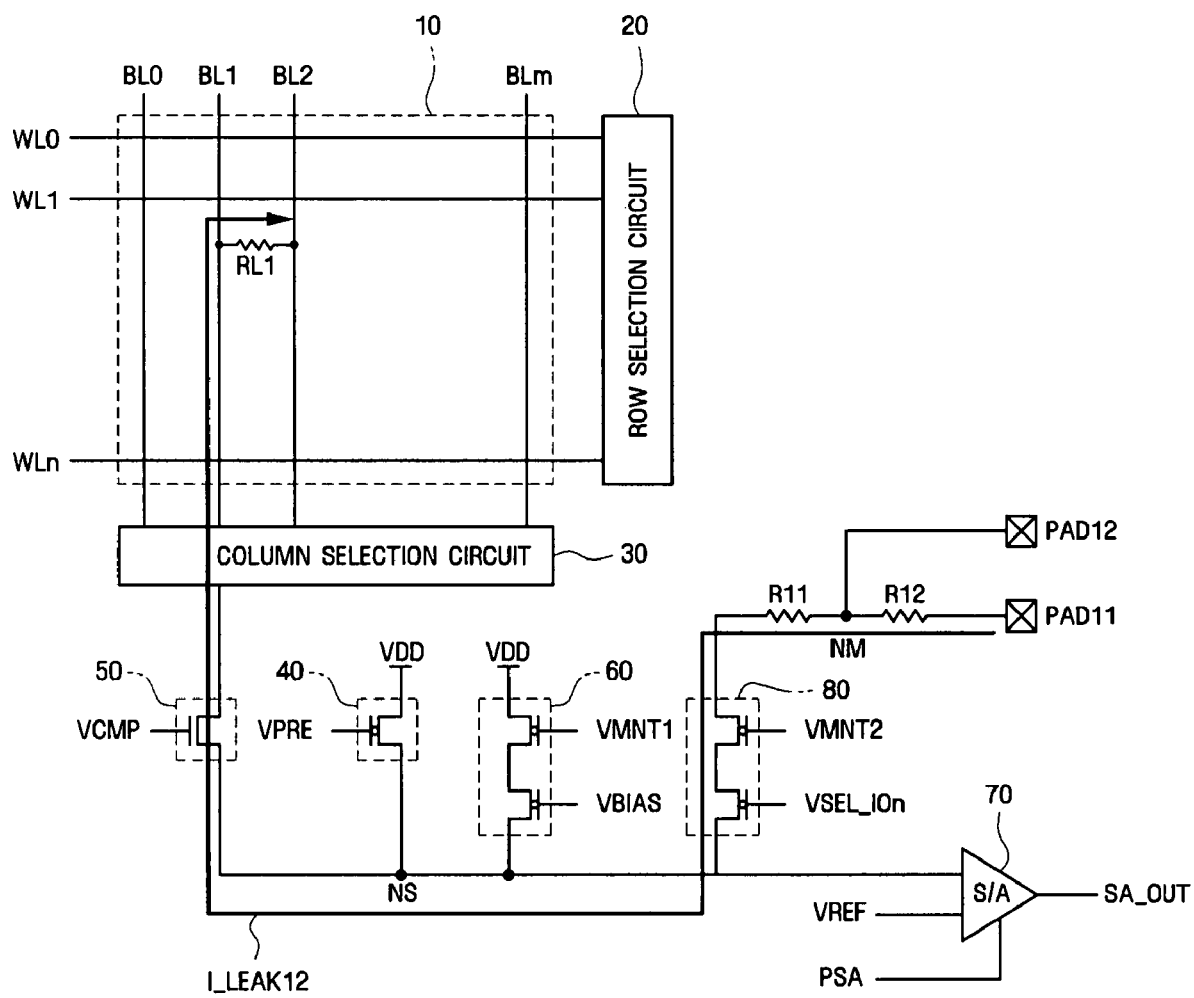
Figure 5:
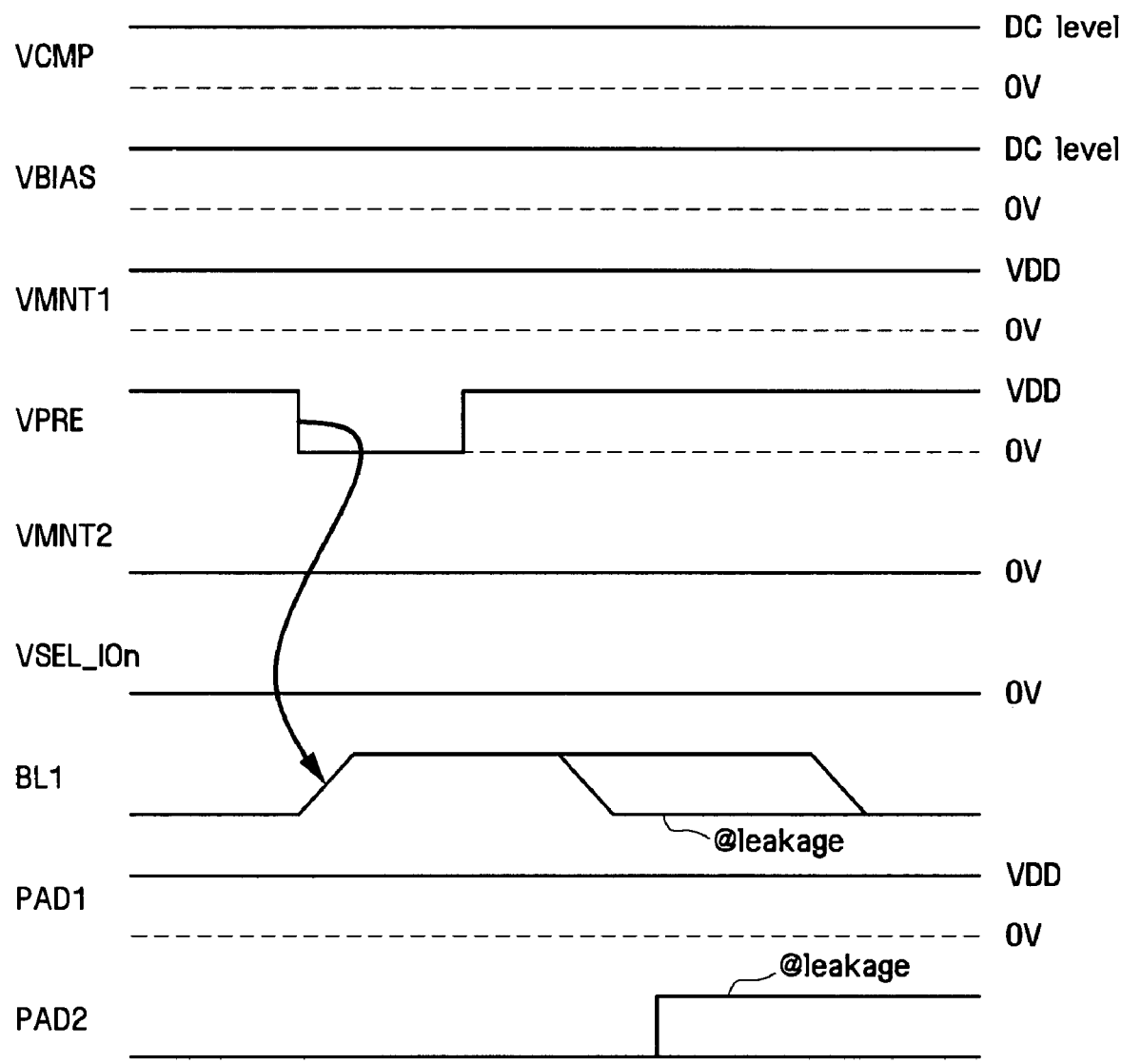

FIGS. 4 and 5 are a circuit diagram and a timing diagram illustrating a method for testing a PRAM according to example embodiments. For brevity, components each having the same function for describing the embodiments shown in FIGS. 2 and 3 are respectively identified by the same reference numerals, and their repetitive description will be omitted.

Referring first to FIG. 4, the PRAM according to example embodiments may include a memory cell array 10, selection circuits 20 and 30, a precharging unit 40, a clamping unit 50, a first monitoring voltage supply unit 60, and a sense amplifier 70. In addition, the PRAM memory according to example embodiments may further include a voltage applying pad PAD11, a monitoring pad PAD12, and a switching unit 80.

The voltage applying pad PAD11 may be coupled to a monitoring node NM coupled to the selected bit line BL1. An external tester may apply a monitoring voltage to the voltage applying pad PAD11. The monitoring voltage may be transferred to the bit line BL1 via the monitoring node NM and a sensing node NS. The monitoring pad PAD12 may be coupled to a monitoring node NM coupled to the selected bit line BL1. The external tester may apply a monitoring voltage to the voltage applying pad PAD11.

The switching unit 80 may be enabled for a testing operation and may be selectively coupled to the monitoring node NM or the sensing node NS. The switching unit 80 may include two PMOS transistors serially coupled between the sensing node NS and the monitoring node NM. Of the two PMOS transistors, one may be turned on in response to the second monitoring control signal VMNT2 and the other may be turned on in response to an input/output selection signal VSEL_IOn.

In example embodiments, as shown in FIGS. 4 and 5, although not shown in the drawing, a second monitoring voltage supply unit that is externally installed, instead of the first monitoring voltage supply unit 60, may be used. Thus, the first monitoring control signal VMNT1 may be maintained at a relatively high level. In addition, because the second monitoring control signal VMNT2 and the input/output selection signal VSEL_IOn are at relatively low levels during a test operation, the sensing node NS and the monitoring node NM may be coupled to each other.

The precharge control signal VPRE may go relatively low and the precharging unit 40 may precharge the selected bit line BL1 by supplying a precharge voltage to the selected bit line BL1 through the sensing node NS. The clamping unit 50 may clamp the voltage level of the selected bit line BL1 to a level of not greater than a threshold voltage level Vth of a phase change material in response to a clamping control signal VCMP in the form of a constant voltage.

The precharge control signal VPRE may be activated back to a relatively high level, so that the precharging unit 40 may stop precharging the selected bit line BL1. If a bridge RL1 exists between the selected bit line BL1 and its adjacent bit line BL2, a leakage current I_LEAK2 from the selected bit line BL1 toward the adjacent bit line BL2 may be generated, and the voltage level of the selected bit line BL1 may be reduced. Conversely, if there is no bridge RL1 between the selected bit line BL1 and its adjacent bit line BL2, suggesting that no leakage current path exists, the voltage level of the selected bit line BL1 may be maintained.

The external tester may sense a level change of the selected bit line BL1 through the monitoring pad PAD12. In example embodiments shown in FIGS. 2 and 3, because occurrence of a leakage current is detected by a plurality of sense amplifiers installed in the PRAM, multiple bit line bridges between each of a plurality of bit lines may be simultaneously created. In example embodiments shown in FIGS. 4 and 5, because occurrence of a leakage current is detected by a comparator installed in the external tester, a level change of a bit line may be sensed a sufficient time after precharging the bit line, thereby sensing even a relatively slight amount of leakage current.

Figure 6:
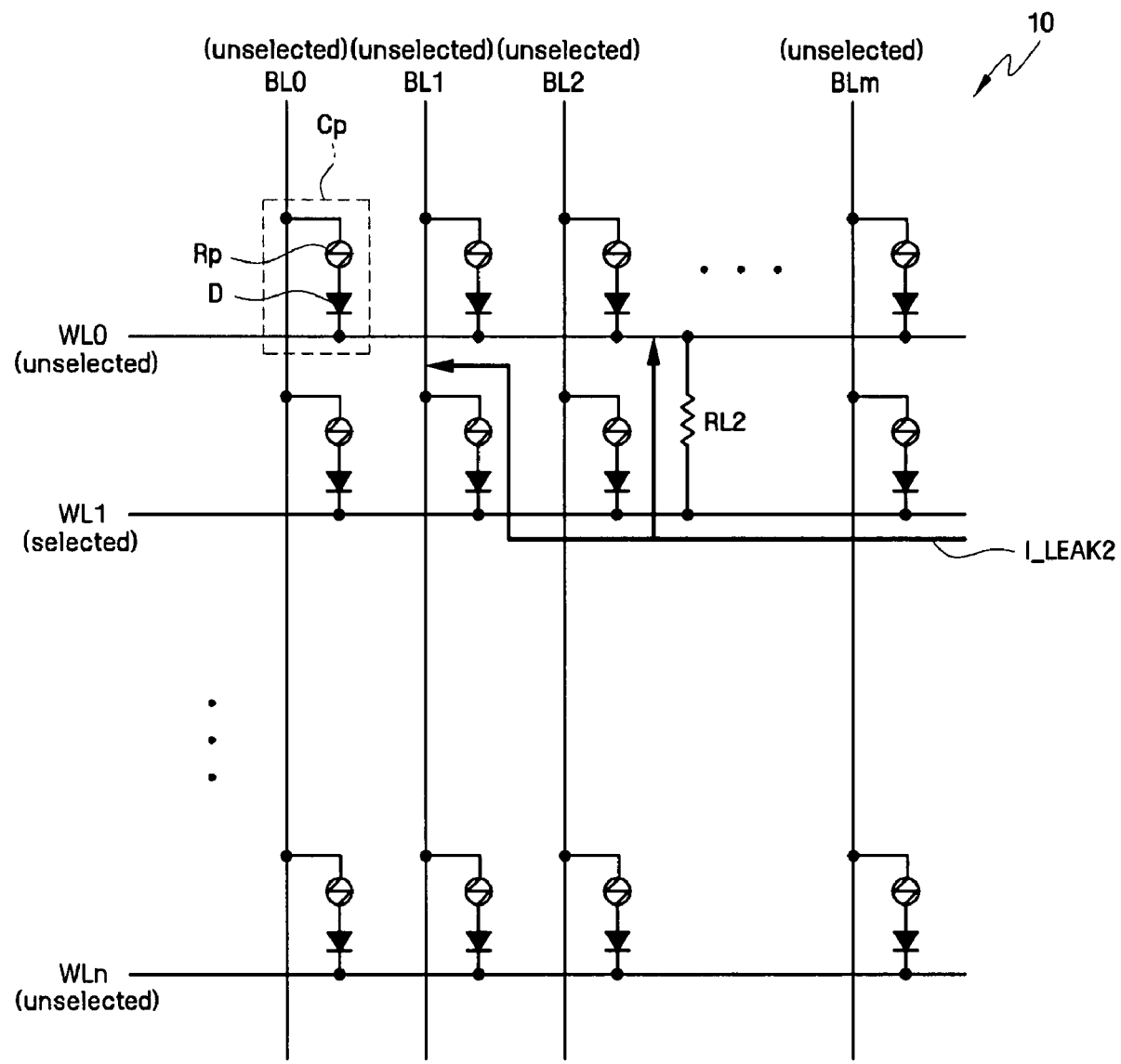
Figure 7:
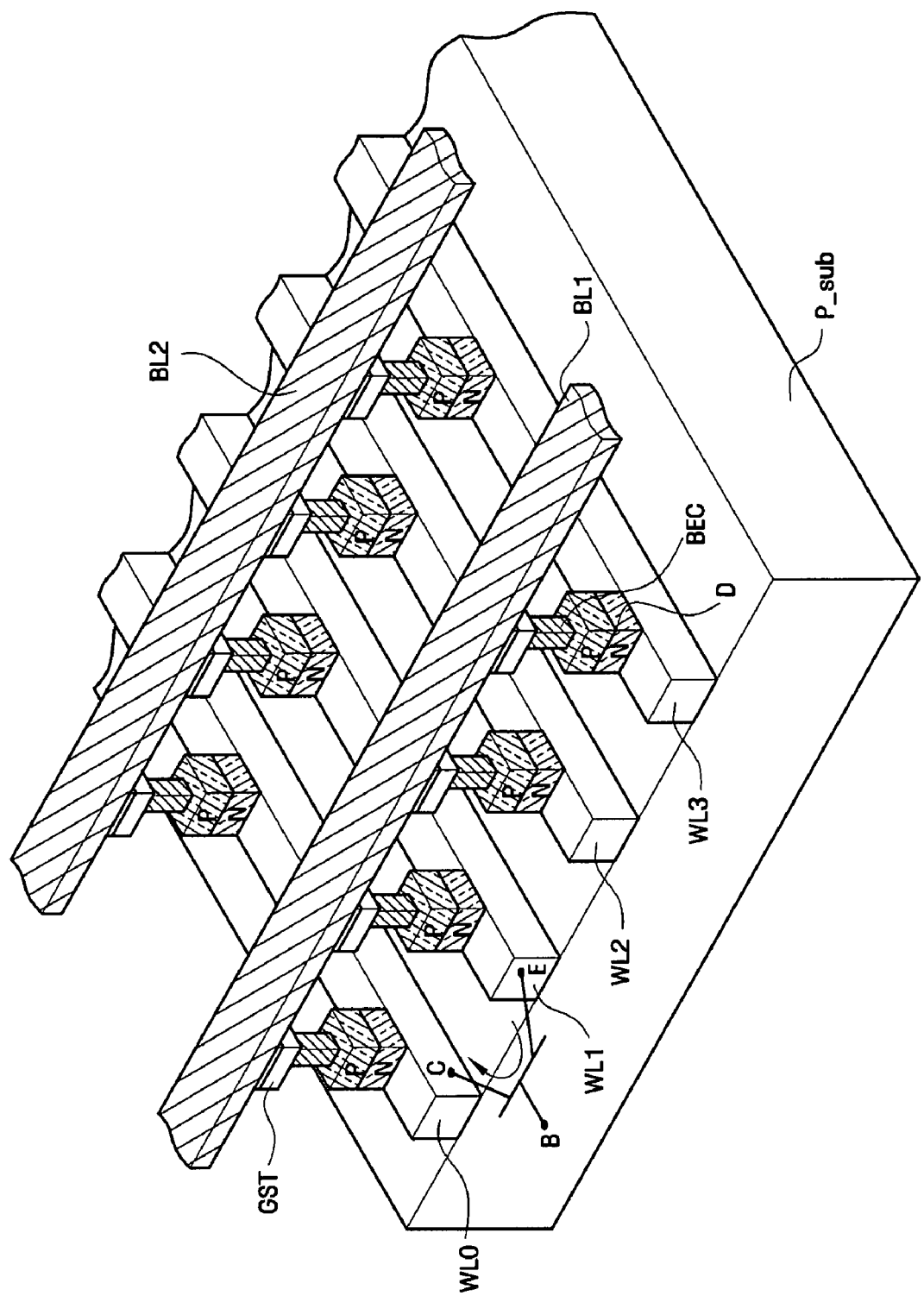

FIG. 6 is a diagram illustrating a method for testing PRAM memories according to example embodiments, and FIG. 7 is a diagram for illustrating an operation of an NPN parasitic bipolar transistor performed between a selected word line and its adjacent word line.

In the discussion that follows, example embodiments are illustrated by reference to a method of effectively monitoring a leakage current generated due to a bridge RL2 created between a word line, e.g., WL1, and its adjacent word line, e.g., WL0. For example, a reverse leakage current of a diode may be used as an access element D, when the generated reverse leakage current exceeds a predetermined or given amount and when the reverse leakage current between a selected word line WL1 and its adjacent word line WL0 is generated due to an operation of the NPN parasitic bipolar transistor.

Referring to FIGS. 6 and 7, the method for testing PRAMs according to example embodiments will now be described. A memory cell array 10 of the PRAM may be provided. Among the plurality of word lines WL0~WLn, at least one word line, e.g., WL1, may be selected, while the other word lines WL0 and WLn and a plurality of bit lines BL1~BLm may all be deselected. The selected word line WL1 may be precharged with a voltage of a constant level, e.g., a boost voltage VPP.

While supplying the selected word line WL1 with a monitoring voltage, a change in the voltage level of the selected word line WL1 may be sensed. When no leakage current path is provided, the change in the voltage level of the selected word line WL1 may be sensed. On the contrary, when a leakage current path is provided, the voltage level of the selected word line WL1 may be reduced. Referring to FIG. 6, two leakage current paths are illustrated by way of example. Because the bridge RL2 is created between the selected word line WL1 and its adjacent word line WL2, a leakage current I_LEAK2 from the selected word line WL1 toward the adjacent word line WL2 may be generated. Also, a reverse leakage current I_LEAK2 of a diode used as an access element D may be generated. If a voltage is applied to the PRAM in a reverse direction to the diode, a reverse leakage current of about 1 nA may be generated. However, a considerable amount of a reverse leakage current, e.g., greater than 1 nA, may be generated depending on parameters of the manufacturing process, resulting in operational failure of the PRAM.

Referring to FIG. 7, additional leakage current path may be illustrated by way of example. A leakage current may be generated by an NPN parasitic bipolar transistor between the selected word line WL1 and its adjacent word line WL0. The PRAM may be configured such that a plurality of N-type word lines WL0-WL3 are arranged on a P-type substrate P_sub and extend in one direction. A plurality of access diodes D may be formed on each of the word lines WL0-WL3 and a lower electrode BEC may be formed on each diode D. A plurality of variable resistance elements GST made of a phase change material, e.g., GeSbTe, may be formed on the respective lower electrodes BEC. A plurality of bit lines BL1 and BL2 may be formed on the plurality of variable resistance elements GST so as to intersect the plurality of word lines WL0-WL3. When a boost voltage VPP is applied to the selected word line WL1 and about 0 V is applied to its adjacent word line WL0, the NPN parasitic bipolar transistor having the selected word line WL1 as its emitter, the P-type substrate P_sub as its base, and the adjacent word line WL0 as its collector, may be turned on, so that the leakage current flowing from the selected word line WL1 to its adjacent word line WL0 may be generated.

Figure 8:
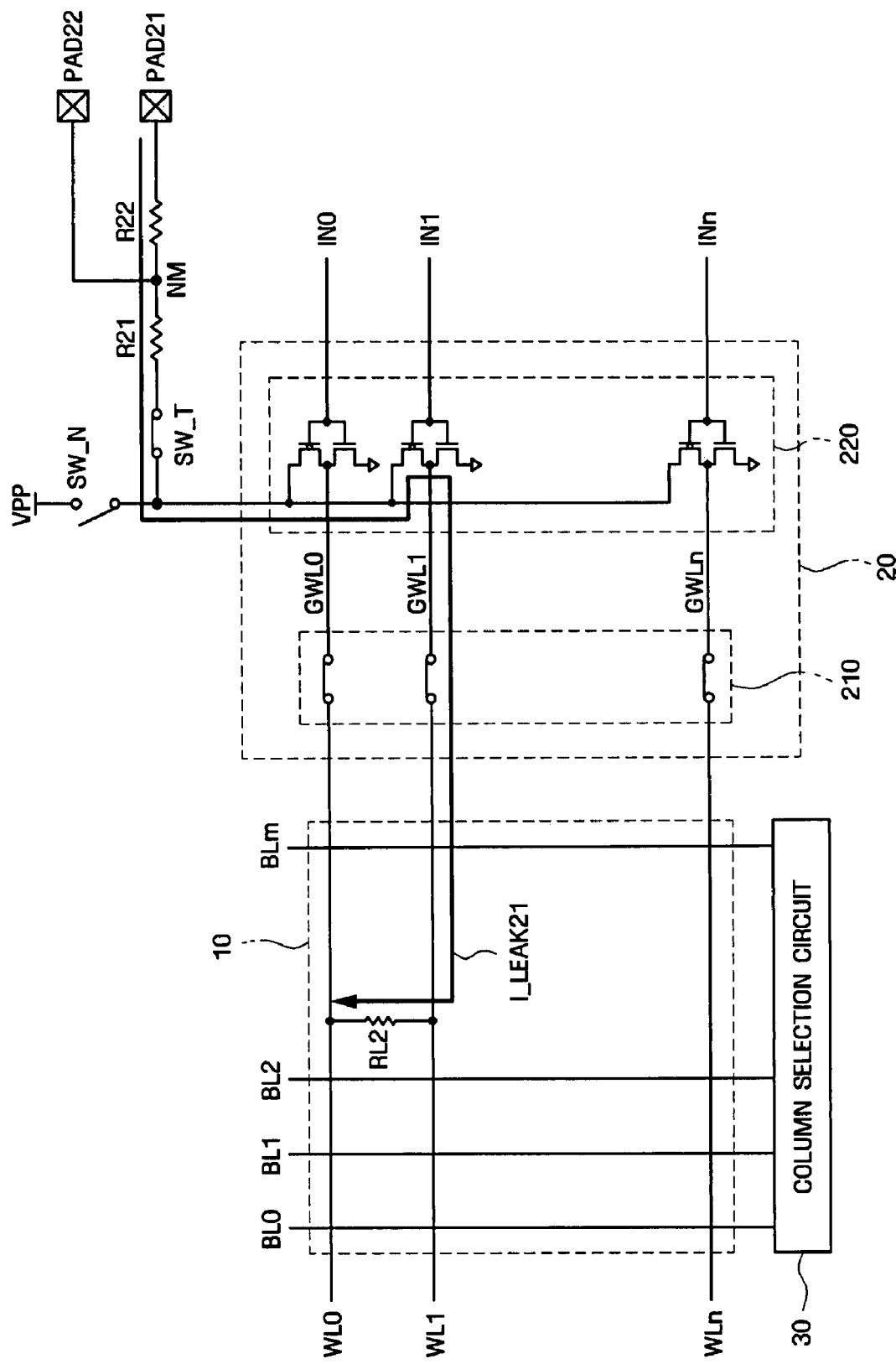
Figure 9:
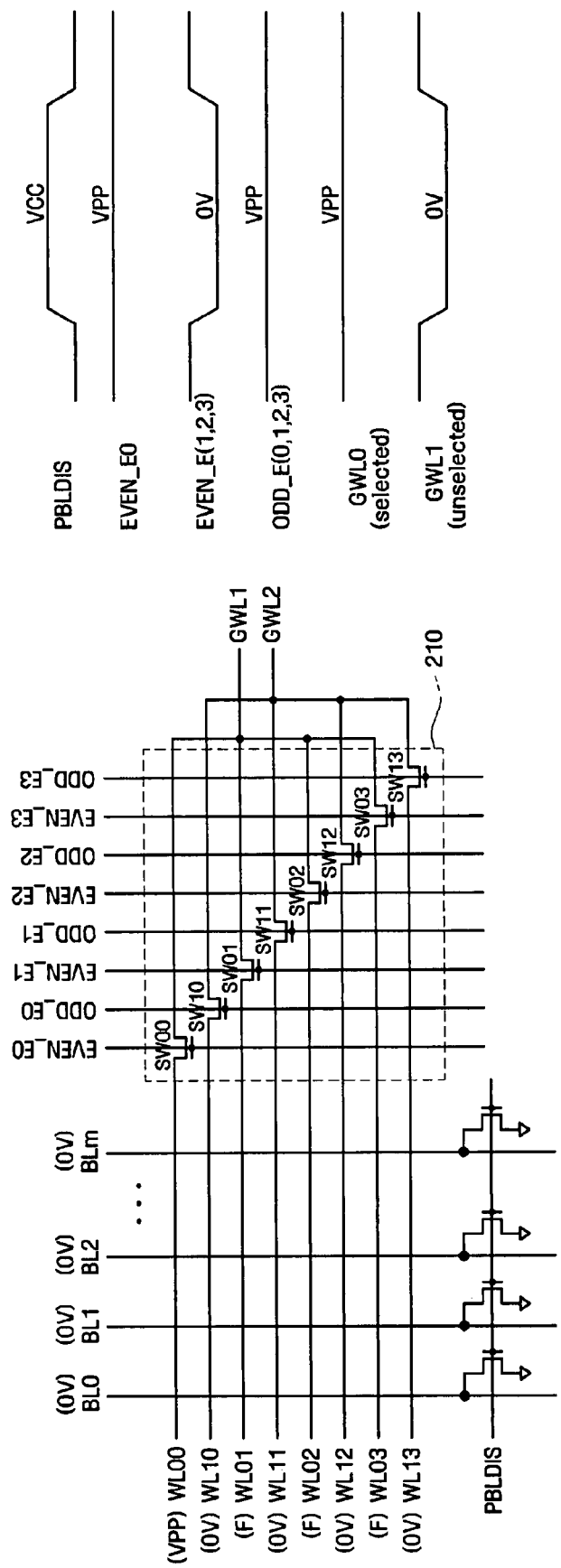

Hereinafter, the method of testing the PRAM shown in FIG. 6 will be described in greater detail with reference to FIGS. 8-12. For brevity of illustration, only a leakage current due to creation of a bridge is illustrated in FIGS. 8-12. FIG. 8 is a circuit diagram illustrating a method for testing a PRAM according to example embodiments, and FIG. 9 illustrates a circuit diagram and a timing diagram of a sub word line driver shown in FIG. 8 for illustrating an operation of the sub word line driver thereof. Referring to FIGS. 8 and 9, a second monitoring voltage supply unit installed in an external tester may supply a monitoring voltage to a voltage applying pad PAD21, and the monitoring voltage may be transferred to a selected word line WL1 via a main decoder 220.

Referring first to FIG. 8, the PRAM according to example embodiments may include a memory cell array 10, selection circuits 20 and 30, a voltage applying pad PAD21, a monitoring pad PAD22, a switch SW_N for normal operation, and a switch SW_T for testing. For example, the selection circuits 20 and 30 may include a row selector 20 and a column selector 30, respectively. The row decoder 20 may include a sub word line driver 210, and the main decoder 220. The sub word line driver 210 may selectively connect global word lines GWL0-GWLn with corresponding word lines WL0-WLn, and may include a plurality of switches SW00-SW13, as shown in FIG. 9. The main decoder 220 may selectively transfer the boost voltage VPP generated from the PRAM to the global word lines GWL0-GWLn during a normal operation, while receiving the monitoring voltage through the voltage applying pad PAD21 to selectively transfer the received monitoring voltage to the global word lines GWL0-GWLn during testing.

The voltage applying pad PAD21 may be coupled to a monitoring node NM coupled to the selected word line WL1. The external tester may apply the monitoring voltage to the voltage applying pad PAD21. The monitoring voltage may be transferred to the selected word line WL1 via the monitoring node NM, the main decoder 220 and the sub word line driver 210.

The monitoring pad PAD22 may be coupled to a monitoring node NM coupled to the selected word line WL1. The external tester may sense a voltage level change of the monitoring node NM through the monitoring pad PAD22 to determine whether a leakage current I_LEAK21 flowing from the selected word line WL1 to its adjacent bit line WL0 has occurred or not. A first resistor R21 may be coupled between the monitoring node NM and the selected word line WL1, and a second resistor R22 may be coupled between the monitoring node NM and the voltage applying pad PAD21. Voltage levels of the monitoring node NM may vary according to a ratio of a resistance value of the first resistor R21 to that of the second resistor R22 and presence or absence of the leakage current I_LEAK21 generated. When there is no leakage current I_LEAK21, the external tester may sense the level of the monitoring node NM depending on the ratio of a resistance value of the first resistor R21 to that of the second resistor R22. When there is a leakage current I_LEAK21, the level of the monitoring node NM, that is sensed by the external tester, may be lower than that sensed when there is no leakage current I_LEAK21.

A method of precharging a selected word line, e.g., WL00, to the boost voltage VPP, will be described with reference to FIG. 9. In order to allow a voltage level of about 0 V to be applied to a plurality of bit lines BL0-BLm, a bit line discharge signal PBLDIS may be activated to a relatively high level. In order to transfer the boost voltage VPP to a selected word line WL00, an enable signal EVEN_E0 turning on a switch SW00 corresponding to the selected word line WL00 may be activated to a relatively high level. In addition, in order to allow a voltage level of about 0 V to be applied to a word line WL10 adjacent to the selected word line WL00, an enable signal ODD_E0 turning on a switch SW10 corresponding to the adjacent word line WL10 may be activated to a relatively high level. While the enable signals ODD_E1, ODD_E2, and ODD_E3 shown in FIG. 9 are all at relatively high levels, they may also be at relatively low levels. Because the boost voltage VPP is applied to the global word line GWL1, the selected word line WL01 may be precharged to a level of the boost voltage VPP. In addition, because about 0 V is applied to the global word line GWL2, the unselected word lines WL10, WL11, WL12, and WL13 may all be at a floated state (F).

Figure 10:
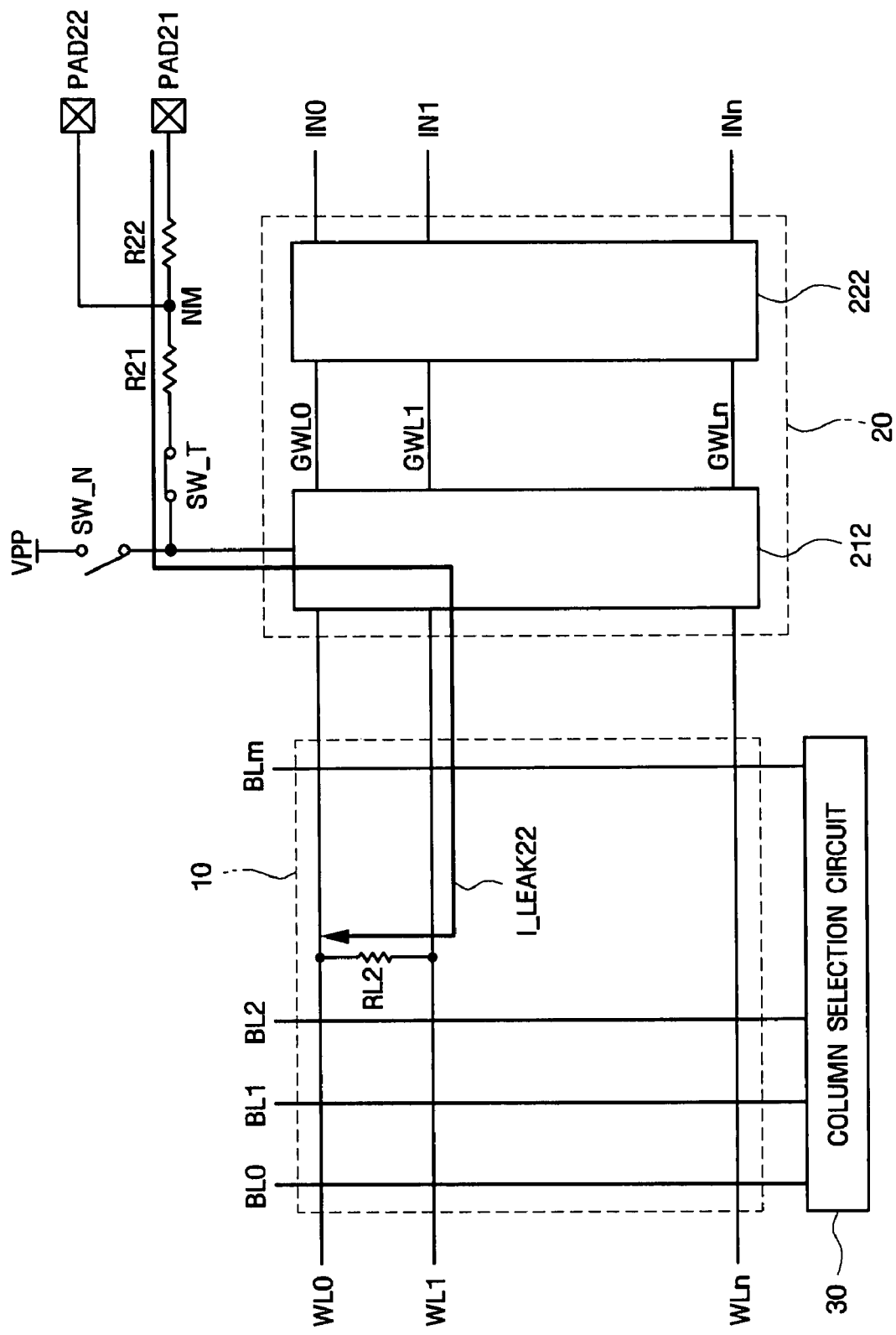
Figure 11:
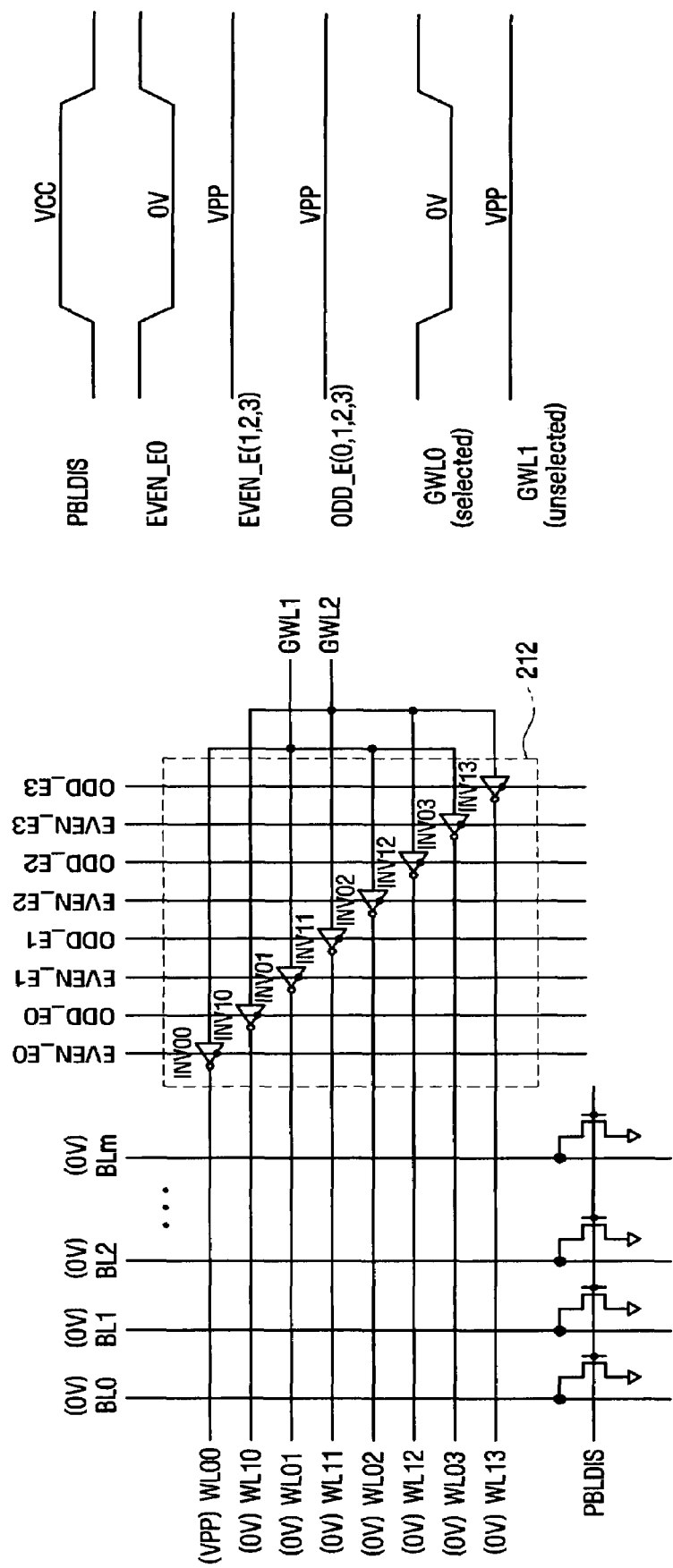
Figure 12:
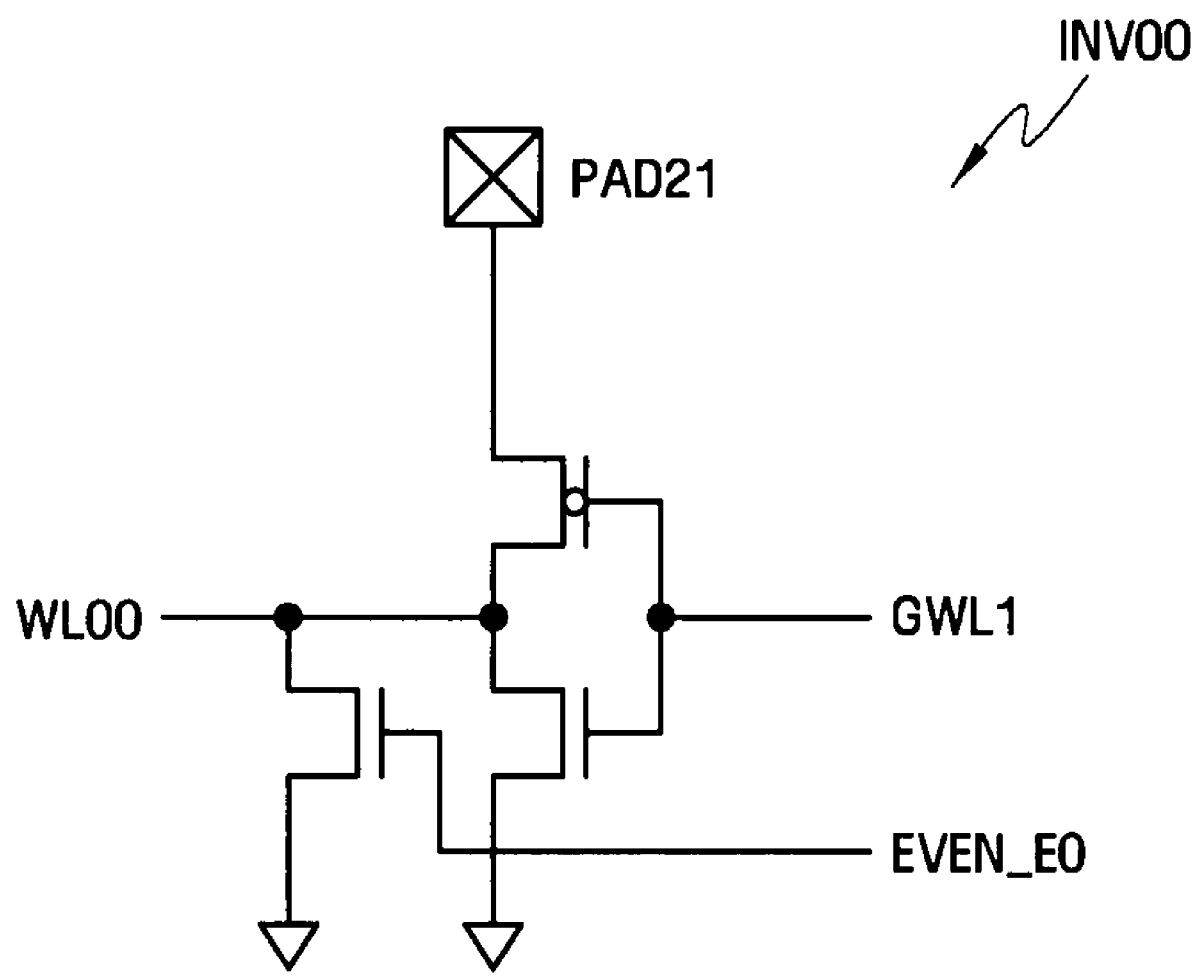

FIG. 10 is a circuit diagram illustrating a method for testing a PRAM according to example embodiments, FIG. 11 illustrates a circuit diagram of a sub word line driver shown in FIG. 10 and a timing diagram for illustrating an operation thereof, and FIG. 12 is a detailed circuit diagram of an inverter shown in FIG. 11. For brevity, components each having the same function for describing the embodiments shown in FIGS. 8 and 9 are respectively identified by the same reference numerals, and their repetitive description will be omitted.

Referring to FIGS. 10 through 12, a second monitoring voltage supply unit installed in an external tester may supply a monitoring voltage to a voltage applying pad PAD21, and the monitoring voltage may be transferred to a selected word line WL1 via a sub word line driver 212. Referring to FIG. 10, a sub word line driver 212 may selectively transfer the boost voltage VPP generated from the PRAM to a word line WL1 during a normal operation, while receiving the monitoring voltage through a voltage applying pad PAD21 to selectively transfer the received monitoring voltage to the word line WL1 during testing. A switch SW_N for normal operation may be turned on during a normal operation while a switch SW_T for testing may be turned on during testing.

The sub word line driver 212 may include a plurality of inverters INV00-INV13, as shown in FIG. 11. For example, an inverter INV00 may include an NMOS transistor and a PMOS transistor coupled between the voltage applying pad PAD21 and a ground voltage, and having their gates connected to a global word line GWL1, and an NMOS transistor coupled between the word line WL00 and the ground voltage and having the enable signal EVEN_E0 applied to its gate. A method of precharging the selected word line WL00 to the boost voltage VPP will be described with reference to FIG. 11. A bit line discharge signal PBLDIS may be activated to a relatively high level to allow about 0 V to be applied to the plurality of bit lines BL0-BLm. In order to transfer the boost voltage VPP to the selected word line WL00, the enable signal EVEN_E0 supplied to the inverter INV00 corresponding to the selected word line WL00 may go low. Because the global word line GWL1 is at a relatively low level, the selected word line WL00 may be precharged to a level of the boost voltage VPP.

In addition, in order to transfer about 0 V to the word line WL10 adjacent to the selected word line WL00, an enable signal ODD_E0 supplied to the inverter INV10 corresponding to the adjacent word line WL10 may be relatively high. Because the global word line GWL2 is at a relatively high level, the voltage level of the adjacent word line WL10 may become about 0 V. While the voltage levels of the word lines WL01, WL11, WL02, WL12, WL03, and WL13 shown in FIG. 1 are all about 0 V, they may also be at a floated state (F).

As described above, according to example embodiments, determining whether a leakage current occurred may be due to creation of bit line bridges or word line bridges. In addition, detecting whether a reverse leakage current of a diode has occurred or not may be possible. Therefore, the PRAMs according to example embodiments have improved reliability.

While example embodiments have been particularly shown and described with reference to example embodiments thereof, it will be understood by those of ordinary skill in the art that various changes in form and details may be made therein without departing from the spirit and scope of the following claims. It is therefore desired that example embodiments be considered in all respects as illustrative and not restrictive, reference being made to the appended claims rather than the foregoing description to indicate the scope of example embodiments.

What is claimed is:

1. A method of testing a phase change random access memory (PRAM) comprising:
    providing a plurality of PRAM cells each coupled between each of a plurality of first lines and each of a plurality of second lines intersecting the first lines;
    selecting at least one of the plurality of first lines while deselecting the remaining first lines and the plurality of second lines;
    pre-charging the selected at least one of the plurality of first lines to a voltage level; and
    sensing a change in the voltage level of the selected first line while supplying a monitoring voltage to the selected first line.

2. The method of claim 1, wherein a first line adjacent to the selected first line is an unselected line.

3. The method of claim 1, wherein the first line is a bit line and the second line is a word line.

4. The method of claim 3, further comprising:
    determining that a leakage current flowing from the selected first line to the unselected first line has occurred when a voltage level of the selected first line is reduced.

5. The method of claim 3, wherein supplying the monitoring voltage includes supplying the monitoring voltage by a monitoring voltage supply unit installed in the PRAM and coupled to the selected first line, and sensing the change in the voltage level of the selected first line includes sensing the change in voltage level of the selected first line by a sense amplifier installed in the PRAM and coupled to the selected first line.

6. The method of claim 3, wherein supplying the monitoring voltage includes applying the monitoring voltage to the selected first line by a monitoring voltage supply unit installed in an external tester through a voltage applying pad coupled to the selected first line, and sensing the change in the voltage level of the selected first line includes sensing the change in voltage level of the selected first line by a comparator installed in the external tester through a monitoring pad coupled to the selected first line.

7. The method of claim 1, wherein the first line is a word line and the second line is a bit line.

8. The method of claim 7, further comprising:
    determining that a leakage current flowing from the selected first line to the unselected first line has occurred when a voltage level of the selected first line is reduced.

9. The method of claim 7, wherein each of the plurality of PRAM cells includes a variable resistor having a phase change material and an access diode.

10. The method of claim 9, further comprising:
    determining that a leakage current flowing from the selected first line to the unselected first line has occurred, or a reverse leakage current of the access diode has occurred when a voltage level of the selected first line is reduced or when a reverse leakage current of the access diode.

11. The method of claim 7, wherein supplying the monitoring voltage includes applying the monitoring voltage to the selected first line by a monitoring voltage supply unit installed in an external tester through a voltage applying pad coupled to the selected first line, and sensing the change in the voltage level of the selected first line includes sensing the change in voltage level of the selected first line by a comparator installed in the external tester through a monitoring pad coupled to the selected first line.

12. The method of claim 11, wherein the monitoring voltage applied through the voltage applying pad is supplied to the selected first line by a main decoder or a sub word line driver.

13. A phase change random access memory (PRAM) comprising:
    a plurality of PRAM cells coupled between each of a plurality of first lines and each of a plurality of second lines intersecting the plurality of first lines;
    a selection circuit selecting at least one first line among the plurality of first lines and deselecting remaining first lines and the plurality of second lines;
    a monitoring node coupled to the selected first line;
    a voltage applying pad coupled to the monitoring node and applying a monitoring voltage to the selected first line; and
    a monitoring pad coupled to the monitoring node and sensing a change in the voltage level of the monitoring node occurring due to a leakage current flowing from the selected first line to the unselected first line.

14. The PRAM of claim 13, wherein the selection circuit deselects a first line adjacent to the selected first line.

15. The PRAM of claim 13, further comprising:
    a first resistor coupled between the monitoring node and the selected first line; and
    a second resistor coupled between the monitoring node and the voltage applying pad.

16. The PRAM of claim 13, wherein the first line is a bit line and the second line is a word line.

17. The PRAM of claim 16, further comprising:
    a precharging unit precharging the selected first line to a voltage level.

18. The PRAM of claim 16, further comprising:
    a sensing node coupled between the selected first line and a sense amplifier; and
    a switching unit coupled between the sensing node and the monitoring node and enabled during testing for selectively coupling of the sensing node or the monitoring node.

19. The PRAM of claim 13, wherein the first line is a word line and the second line is a bit line.

20. The PRAM of claim 19, further comprising:
    a main decoder or a sub word line driver coupled between selected first line and the monitoring node, wherein the monitoring voltage applied through voltage applying pad is supplied to the selected first line by the main decoder or the sub word line driver.

21. A phase change random access memory (PRAM) comprising:
    a plurality of PRAM cells coupled between each of a plurality of bit lines and each of a plurality of word lines intersecting the plurality of bit lines;
    a selection circuit selecting at least one bit line among the plurality of bit lines and deselecting remaining bit lines and the plurality of word lines;
    a sensing node coupled to the selected bit line;
    a precharging unit coupled to the sensing node and precharging the selected bit line to a voltage level through the sensing node;
    a monitoring voltage supply unit coupled to the sensing node and applying a monitoring voltage to the selected bit line through the sensing node; and a sense amplifier coupled to the sensing node and sensing a change in the voltage level of the sensing node occurring due to a leakage current flowing from the selected bit line to the unselected bit line.

22. The PRAM of claim 21, further comprising:

a monitoring node;

a switching unit coupled between the sensing node and the monitoring node and enabled during testing for selectively coupling of the sensing node or the monitoring node;

a voltage applying pad coupled to the monitoring node and applying the monitoring voltage to the selected first line through the monitoring node; and a monitoring node pad coupled to the monitoring node and sensing a change in the voltage level of the monitoring node occurring due to a leakage current flowing from the selected bit line to the unselected bit line.

* * * * *